(12) United States Patent
Shimokawa et al.

(10) Patent No.: US 10,481,023 B2
(45) Date of Patent: Nov. 19, 2019

(54) MECHANICAL QUANTITY MEASURING DEVICE AND SENSOR UNIT

(71) Applicant: Hitachi Automotive Systems, Ltd., Hitachinaka-shi, Ibaraki (JP)

(72) Inventors: Hanae Shimokawa, Tokyo (JP); Hiroyuki Oota, Tokyo (JP); Atsushi Kazama, Tokyo (JP); Shohei Hata, Tokyo (JP); Takuto Yamaguchi, Tokyo (JP); Atsuo Soma, Hitachinaka (JP); Kisho Ashida, Hitachinaka (JP); Junji Onozuka, Hitachinaka (JP); Kentarou Miyajima, Hitachinaka (JP); Masayuki Hio, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 185 days.

(21) Appl. No.: 15/107,246
(22) PCT Filed: Jan. 26, 2015
(86) PCT No.: PCT/JP2015/052025
§ 371 (c)(1),
(2) Date: Jun. 22, 2016
(87) PCT Pub. No.: WO2015/115367
PCT Pub. Date: Aug. 6, 2015

(65) Prior Publication Data
US 2017/0108390 A1 Apr. 20, 2017

(30) Foreign Application Priority Data
Jan. 30, 2014 (JP) .................. 2014-015383

(51) Int. Cl.
*G01L 9/00* (2006.01)
*G01L 19/04* (2006.01)
*G01L 19/14* (2006.01)

(52) U.S. Cl.
CPC ............ *G01L 9/0048* (2013.01); *G01L 19/04* (2013.01); *G01L 19/147* (2013.01);
(Continued)

(58) Field of Classification Search
CPC ..... G01L 9/0048; G01L 19/04; G01L 19/147; G01L 19/148
(Continued)

(56) References Cited

U.S. PATENT DOCUMENTS 5,693,884 A 12/1997 Kato
5,945,605 A * 8/1999 Julian et al. ........ G01L 19/0627
257/419

(Continued)

FOREIGN PATENT DOCUMENTS

JP 2-168133 A 6/1990
JP 5-73551 U 10/1993

(Continued)

OTHER PUBLICATIONS

Bibliographic Data and English Translation of JP2002261104A, Date: Sep. 13, 2002, publisher of translation: Espacenet, pp. 10.*

(Continued)

*Primary Examiner* — Daniel S Larkin
(74) *Attorney, Agent, or Firm* — Crowell & Moring LLP

(57) ABSTRACT

A mechanical quantity measuring device includes: a sensor chip having a strain detector formed on a surface of a semiconductor substrate and a plurality of electrodes connected to the strain detector; a stem having ascot that protrudes from an adjacent peripheral portion and has an upper surface that is attached to a lower surface of the sensor chip by a bonding material formed from a metallic material or a glass material; a lead-out wiring part including a plurality of wires that are electrically connected to the plurality of electrodes; and a fixing part for fixing the stem, wherein: the stem and the fixing part are integrally molded or fixed through metallic bonding or mechanical bonding.

14 Claims, 15 Drawing Sheets

(52) U.S. Cl.
CPC ............... *H01L 2224/48091* (2013.01); *H01L 2224/49171* (2013.01); *H01L 2224/73265* (2013.01)

(58) Field of Classification Search
USPC .......................................................... 73/726
See application file for complete search history.

(56) References Cited

U.S. PATENT DOCUMENTS

| | | | |
|---|---|---|---|
| 6,021,673 A | 2/2000 | Takeuchi et al. | |
| 2004/0200286 A1* | 10/2004 | Mast | G01L 19/0084 73/715 |
| 2005/0087020 A1* | 4/2005 | Ueyanagi et al. | G01L 19/0084 73/753 |
| 2005/0178208 A1 | 8/2005 | Benzel et al. | |

FOREIGN PATENT DOCUMENTS

| | | | | |
|---|---|---|---|---|
| JP | 8-166305 A | | 6/1996 | |
| JP | 9-196966 A | | 7/1997 | |
| JP | 11-223568 A | | 8/1999 | |
| JP | 2002261104 A | * | 9/2002 | ............. H01L 24/29 |
| JP | 2005-227283 A | | 8/2005 | |
| JP | 2012071347 A | * | 4/2012 | ........... B23K 1/0016 |
| WO | WO 2013/078183 A2 | | 5/2013 | |

OTHER PUBLICATIONS

Bibliographic Data and English Translation of JP2012071347A, Date: Apr. 12, 2012, publisher of translation: Espacenet, pp. 33.*
International Search Report (PCT/ISA/210) issued in PCT Application No. PCT/JP2015/052025 dated Feb. 24, 2015 with English translation (5 pages).
Japanese-language Written Opinion (PCT/ISA/237) issued in PCT Application No. PCT/JP2015/052025 dated Feb. 24, 2015 (5 pages).

\* cited by examiner

MECHANICAL QUANTITY MEASURING DEVICE AND SENSOR UNIT

TECHNICAL FIELD

The present invention relates to a mechanical quantity measuring device equipped with a strain detector and to a sensor unit.

BACKGROUND ART

A technique that employs a metal foil strain gauge which utilizes changes in a resistance value of a metal foil as caused by strain is known as a method for measuring deformations such as strain on a measurement object. This is a technique that enables measurement of strain on the measurement object by adhesively attaching the strain gauge to the measurement object, causing the metal foil to change its length in accordance with the strain on the measurement object, and detecting changes in the resistance value of the metal foil as a result of changing its length.

A semiconductor strain sensor in which a semiconductor piezoelectric element is formed by doping a surface of a semiconductor substrate with impurities is being examined as a mechanical quantity measuring device for measuring the deformations such as the strain on the measurement object with high accuracy.

One example of such semiconductor strain sensor is known which has a structure in which a sensor chip equipped with a semiconductor strain unit is soldered onto a metallic stem and the metallic stem is adhesively attached to the measurement object by using an adhesive agent made of resin.

It is described that the metallic stem interposed between the measured object and the sensor chip reduces the strain caused on the sensor chip due to the deformations of the measurement object and prevents or inhibits breakage of the sensor chip (see PTL 1).

CITATION LIST

Patent Literature

PTL 1: International Publication WO2013/084294

SUMMARY OF INVENTION

Technical Problem

When the mechanical quantity measuring device described in the above-mentioned PTL 1 is used under a high-temperature environment, the adhesive agent made of resin for adhesively attaching the measurement object and the metallic stem together deteriorates or is modified, thereby resulting in insufficient bonding power. Accordingly, the deformations of the measurement object will not accurately impose the load on the metallic stem and detection accuracy will degrade.

Solution to Problem

A mechanical quantity measuring device according to a first aspect of the present invention comprises: a sensor chip having a strain detector formed on a surface of a semiconductor substrate and a plurality of electrodes connected to the strain detector; a stem having a seat that protrudes from an adjacent peripheral portion and has an upper surface that is attached to a lower surface of the sensor chip by a bonding material formed from a metallic material or a glass material; a lead-out wiring part including a plurality of wires that are electrically connected to the plurality of electrodes; and a fixing part for fixing the stem, wherein: the stem and the fixing part are integrally molded or fixed through metallic bonding or mechanical bonding.

Advantageous Effects of Invention

According to the present invention, the load generated on the fixing part is transmitted to the stem almost without any loss. Therefore, high-accuracy detection capability can be maintained even under the high-temperature environment.

BRIEF DESCRIPTION OF DRAWINGS

FIG. 6($b$) is a diagram illustrating deformations when the stem is displaced in the sensor unit according to the present invention as illustrated in FIG. 2;

DESCRIPTION OF EMBODIMENTS

[Basic Structure of Invention]

A basic structure of a mechanical quantity measuring device according to an embodiment of the present invention is as follows.

A sensor chip has a strain detector formed on a surface of a semiconductor substrate and a plurality of electrodes connected to the strain detector, A stem has a seat that protrudes from an adjacent peripheral portion. An upper surface of the seat at the stem is bonded to a lower surface of the sensor chip by a bonding material formed from a metallic material or a glass material. The mechanical quantity measuring device further includes a fixing part for fixing the stem. The stem and the fixing part are integrally molded or fixed through welding or mechanical bonding and do not have a fixing structure that uses an adhesive agent made of resin.

The mechanical quantity measuring device according to an embodiment of the present invention can adopt an aspect in which the fixing part is a measured object.

Moreover, the mechanical quantity measuring device according to an embodiment of the present invention can adopt an aspect in which an opening is formed at the fixing part so as to expose the stem and pressures of gas and liquid that act on the stem via the opening are measured. This aspect should preferably employ a structure to provide a groove to partly reduce rigidity of the stem on aback surface of the seat at the stem.

Embodiments with respect to the above-described respective aspects will be explained below with reference to drawings.

Embodiment 1

[Overall Configuration]

An embodiment of the mechanical quantity measuring device according to the present invention will be explained with reference to FIG. 1 to FIG. 3.

Figure 1:
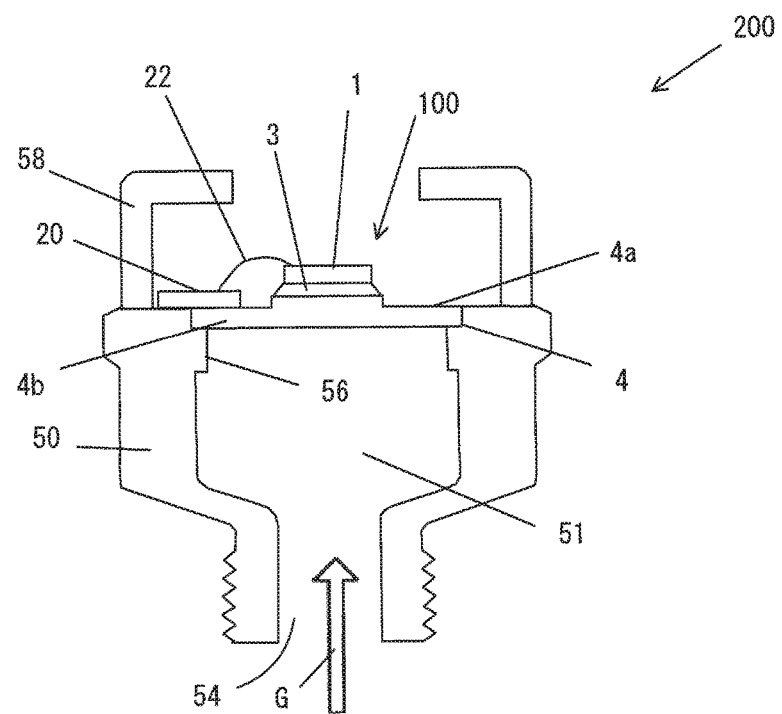
FIG. 1 is a sectional view of an embodiment of a mechanical quantity measuring device according to the present invention.

FIG. 1 is a sectional view of the embodiment of the mechanical quantity measuring device according to the present invention.

A mechanical quantity measuring device 200 is composed of a sensor unit 100, a container (fixing part) 50 into which gas G to be measured is introduced, and a case 58.

The sensor unit 100 includes a sensor chip 1, a stem 4, a printed circuit board 20, bonding wires 22 for connecting electrodes of the sensor chip 1 and connecting terminals of the printed circuit board 20, and a bonding part 3 for bonding the sensor chip 1 and the stem 4.

The sensor chip 1 has a strain detector 2 (see FIG. 2) as described later and the mechanical quantity measuring device 200 detects the pressure of the gas G which flows into an internal space 51 of the container 50.

The container 50 is made from, for example, substantially is formed in a cylindrical shape and the stem 4 of the sensor unit 100 is fixed to the container 50. The case 58 is formed of a resin or metallic member and protects the sensor unit 100 fixed to the container 50.

The container 50 is formed in a hollow, substantially cylindrical shape having the internal space 51. A gas intake 54 that introduces the gas G into the internal container 51 is formed in a lower part of the container 50 and an opening 56 that exposes the lower surface of the stem 4 is formed in an upper part of the container 50. In other words, the container 50 is formed as a cylindrical pressure introducing part.

The stem 4 is made from, for example, Fe—Ni alloys (such as 42 alloy or invar), Mo, SUS, or Al. The stem 4 also functions as a cover of the container 50.

The stem 4 and the container 50 are integrally molded or fixed through metallic bonding or mechanical bonding such as fastening or crimping. Specifically speaking, the mechanical quantity measuring device 200 fixes the stem to a fixing part, that is, the container 50 by a highly heat-resistant fixing method. Examples of a method of the integral molding or integral forming include sheet metal working such as drawing. Regarding the metallic bonding, laser welding, ultrasonic welding, friction stir welding, soldering, or brazing can be applied. Regarding the fastening, for example, it is possible to employ a method of inserting a fastening member such as a screw into an opening (not shown) in the stem 4 and fastening it to a female screw part (not shown) of the container 50. Regarding the crimping, for example, it is possible to use a structure to fix the peripheral portion of the stem 4 by means of a crimping member provided at the opening 56 in the container 50.

[Sensor Unit]

Figure 2:
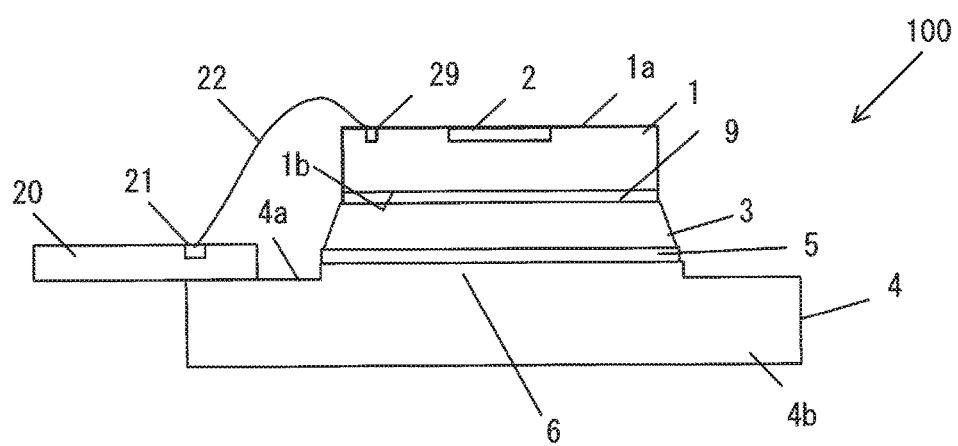
FIG. 2 is an enlarged view of a sensor unit illustrated in FIG. 1.
Figure 3:
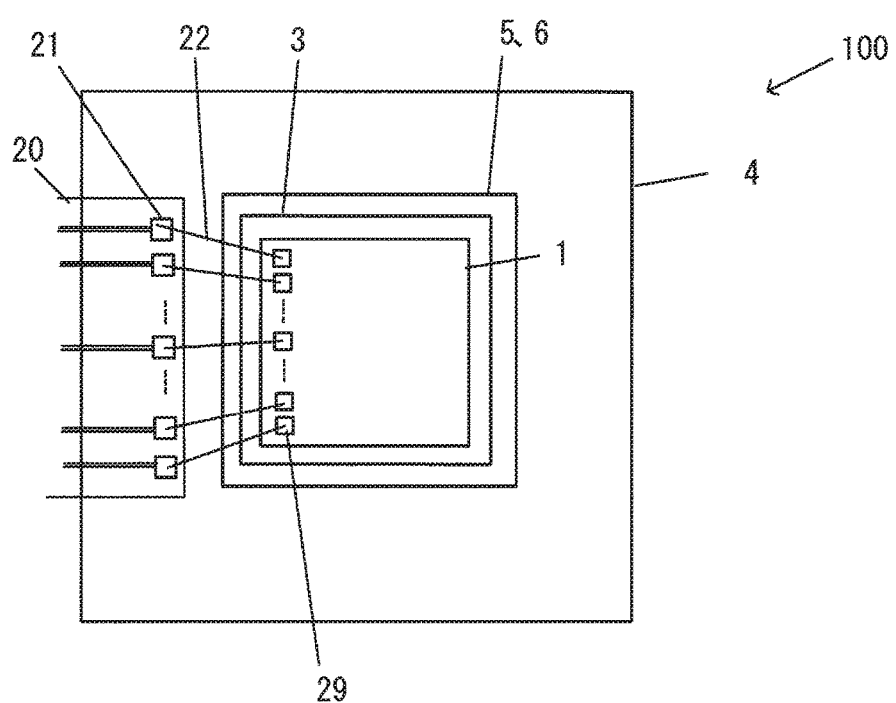
FIG. 3 is a plan view of the sensor unit illustrated in FIG. 2 as viewed from above.

FIG. 2 is an enlarged view of the sensor unit illustrated in FIG. 1 and FIG. 3 is a plan view of the sensor unit illustrated in FIG. 2 as viewed from above.

The sensor chip 1 is formed of a semiconductor substrate made of silicon or the like in, for example, a rectangular parallelepiped shape with the length and the width of approximately 1 mm to 7 mm and the thickness of 30 to 400 μm. The sensor chip 1 has the strain detector 2 located on its principal surface 1$a$ and electrode pads 29 located near the strain detector 2 and connected to the strain detector 2.

The strain detector 2 is, for example, a Wheatstone bridge circuit formed of resistive elements (not shown in the drawings) formed by doping a surface of the silicon substrate with impurity ions. Accordingly, strain is detected as expansion and contraction of the sensor chip 1 in its plane direction cause changes in a resistance value of impurity diffusion resistance. If a temperature detector is formed at the sensor chip 1, temperature correction of a measured value can be made possible and strain quantity can be measured with higher accuracy. A heat strain influence on the sensor chip 1 can be reduced by outputting the detected strain as a potential difference between X-direction strain and Y-direction strain.

Such a sensor chip is disclosed in International Publication WO2013/078183 described as PTL 1.

A metalized layer 9 is formed over almost an entire back surface 1$b$ of the sensor chip 1.

The stem 4 is a rectangular-shaped thin plate member on which a seat 6 that is protruded from a central part of an upper surface 4$a$ is formed. The seat 6 has a rectangular shape slightly larger than the sensor chip 1. A metalized layer 5 is formed on an entire upper surface of the seat 6. The stem 4 is made of a metallic material such as SUS, 42 alloy, invar, molybdenum, Al, Al alloy, Cu, Cu alloy, and/or ClC. The stem 4 can be made of materials other than metals, for example, an insulating material such as ceramics.

The metalized layers 5 and 9 are formed by, for example, vapor deposition, sputtering, or plating and is composed of, for example, Au, Ni, Cu, Zn, Pt, Ag, Ti, Cr, or W. Alternatively, the metalized layer 5 or 9 may be configured by combining two or more of the above-mentioned metals. For example, the metalized layer 5 or 9 may be configured by applying a thin Au layer over a Ni layer.

Incidentally, the stem 4 may be a thin plate member of a disc shape instead of the rectangular shape. In this case, the stem 4 and the container 50 may be fixed together by screw fastening. For example, a method of providing a male screw part on a peripheral portion 4$b$ of the stem 4, providing a female screw part on an inner peripheral surface of the opening 56 in the container 50, and fixing the stem 4 to the container 50 by screwing the stem 4 into the container 50 and making them engage with each other can be employed as the screw fastening.

The bonding part 3 is provided between the metalized layer 5 and the metalized layer 9 and the sensor chip 1 is bonded to the stem 4 via the bonding part 3. The bonding part 3 is composed of, for example, metallic materials of relatively low melting points, resin materials, and glass-based fixing materials. Examples of the metallic materials may include solder containing Sn as its principal component (for example, Sn-3.5 wt % Ag solder, Sn-3 wt % Ag-0.5 wt % Cu solder, Sn-5 wt % Sb solder, and solder containing other elements such as Bi, In, and/or Zn added to the above-listed elements), Au-based solder containing a large amount of Au (for example, Au-20 wt % Sn solder, Au-12 wt % Ge solder, Au-3.15 wt % Si solder, and solder containing a third element in addition to the above-listed elements), or solder containing a large amount of Ag.

An upper surface of the bonding part 3 is bonded to almost the entire surface of the metalized layer 9. Specifically speaking, the upper surface of the bonding part 3 is formed so as to correspond to each side of the metalized layer 9 so that each side of the bonding part 3 substantially matches each side of the metalized layer 9. Similarly, a lower surface of the bonding part 3 is bonded to almost the entire surface of the metalized layer 5. Since a planar size of the seat 6 at the stem 4 is slightly larger than that of the sensor chip 1, a section of the bonding part 3 has a substantially trapezoidal shape.

At least part of the printed circuit board 20 is mounted on the upper surface 4a of the peripheral portion 4b outside the seat 6 of the stem 4. Electrode pads 21 on the printed circuit board 20 and the electrode pads 29 on the sensor chip 1 are connected via a plurality of bonding wires (lead-out wiring part) 22 using, for example, Au wires. The printed circuit board 20 may be a substrate using a glass epoxy material, a flexible substrate using a polyimide material or other materials, or a ceramic substrate.

[Bonding of Sensor Chip and Stem]

An embodiment of a method for bonding the sensor chip 1 and the stem 4 will be explained.

Figure 4A:
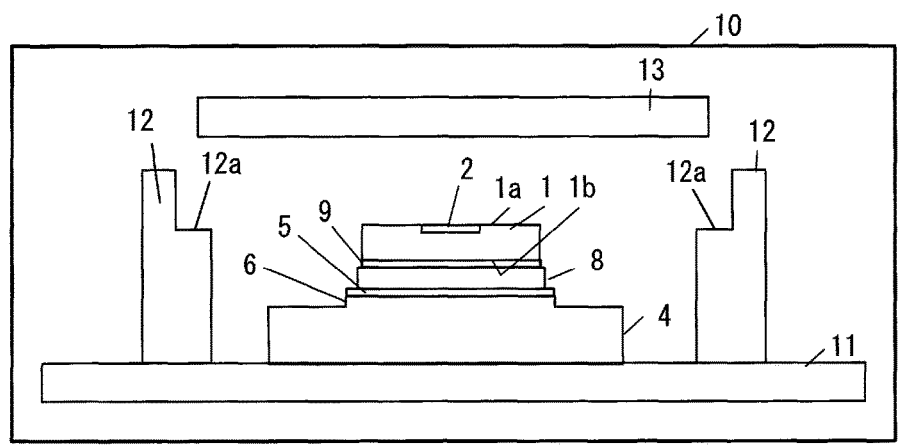
FIG. 4($a$) and FIG. 4($b$) are diagrams for explaining an embodiment of a method for manufacturing the mechanical quantity measuring device illustrated in FIG. 1.
Figure 4B:
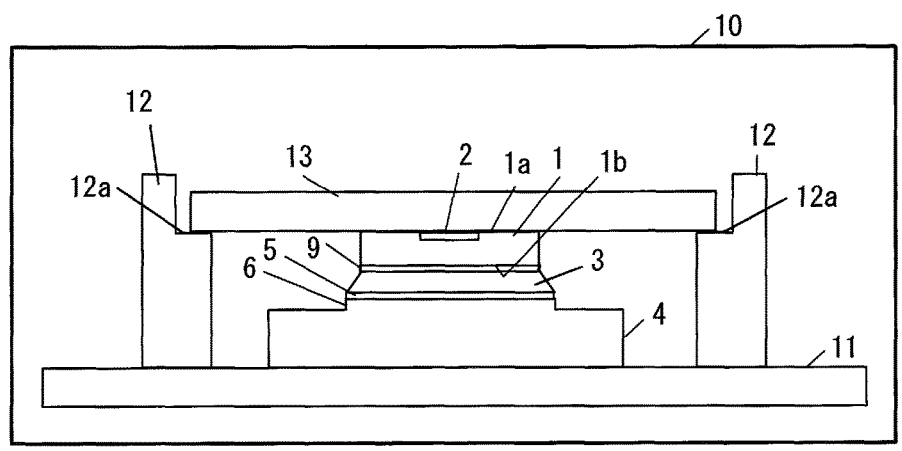

FIG. 4(a) and FIG. 4(b) are diagrams for explaining an embodiment of a method for manufacturing the mechanical quantity measuring device illustrated in FIG. 1.

The metalized layer 9 is formed on the back surface 1b of the sensor chip 1 and the metalized layer 5 is formed on the upper surface of the seat 6 for the stem 4 in advance.

The stem 4 with the metalized layer 5 formed on the upper surface of the seat 6 is placed in a heating furnace 10. Bonding correction jigs 12 for adjusting the thickness of the bonding part 3 are also set in the heating furnace 10 as described later.

A bonding material 8 is placed on the metalized layer 5. This bonding material 8 is a material for the bonding part 3. The sensor Chip 1 with the metalized layer 9 formed on the back surface 1b is mounted on the bonding material 8. The center of the sensor chip 1 is positioned to substantially coincide with the center of the seat 6 and the sensor chip 1 is positioned so that gaps between the respective sides of the sensor chip 1 and the respective sides of the seat 6 become almost the same. This state is illustrated in FIG. 4(a).

A weight 13 is mounted on the principal surface 1a of the sensor chip 1. Each bonding correction jig 12 is provided with a stepped part 12a on its inside surface and the weight 13 is formed with a length enabling it to be mounted on the stepped parts 12a.

Heating is performed in this state by using, for example, a heater 11. When the temperature of the stem 4 rises as a result of heating, the bonding material 8 melts or softens and is bonded to the metalized layer 9 on the back surface 1b of the sensor chip 1 and to the metalized layer 5 of the stem 4. Accordingly, the bonding material 8 becomes the bonding part 3.

The thickness of the bonding part 3 can be set to a specified thickness according to the weight of the weight 13 and the shape of the bonding material 8; however, it is preferable that the thickness of the bonding part 3 should be made uniform according to the height of the stepped parts 12a of the bonding correction jigs 12 as illustrated in FIG. 4(a) and FIG. 4(b). In this case, the weight of the weight 13 should be sufficiently heavy and the stepped parts 12a are designed to stop descent of the weight 13. As a result, the thickness of the bonding part 3 can be made uniform. This state is illustrated in FIG. 4(b).

Under this circumstance, it is possible to prevent oxidation of the surface of the bonding material 8 and achieve good bonding by controlling the atmosphere inside the heating furnace 10. For example, $N_2$ is effective as the atmosphere. Besides this, reductive hydrogen, a mixture of these elements, or organic acids such as formic acid may be used. Moreover, organic substances such as flux capable of reducing a surface oxide may be used. Furthermore, reducing voids is effective by creating a vacuum in the heating furnace. A good bonding part 3 with little defects such as the voids can be obtained by employing such contrivance. In order to further enhance bondability, it is effective to apply, for example, sputtering processing or plasma cleaning to the stem 4, the back surface 1b of the sensor chip 1, the surface of the bonding material 8, and so on before bonding them so as to remove or reduce an organic contamination amount of the bonding member or oxide films.

The above explanation was given about the method of bonding the sensor chip 1 and the stem 4 by using the heating furnace 10. However, the sensor chip 1 and the stem 4 can be bonded by using a die bonder.

An example of the case where the die bonder is used will be explained below. The bonding material 8 is supplied onto the metalized layer 5 of the stem 4 by using the die bonder. Meanwhile, the sensor chip 1 is vacuum-sucked by using a collet or the like to press and attach the sensor chip 1 to the bonding material 8 via, the metalized layer 9. The collet is heated with a pulse current (pulse heating) or heated with a constant current (constant heating) in the above-described state to cause the bonding material 8 to melt or soften, thereby bonding the sensor chip 1 and the stem 4 together. By heating the base substrate in advance, bonding time can be further shortened. By creating an inert atmosphere in the vicinity of the bonding part in the case of bonding by the die bonder, better bonding can be achieved.

When the thickness of the bonding part 3 has little variability, the sensor chip 1 is substantially parallel to the upper surface of the seat 6, and the length between each side of the sensor chip 1 and each side of the seat 6 is made substantially uniform, the deformation amount transmitted through the bonding part 3 to the sensor chip 1 becomes uniform in each direction, thereby enhancing detection accuracy. As a flow of the molten bonding material 8 is stopped by each side part of the seat 6, the bonding part 3 can be easily arranged to a specified shape. In other words, if each side part of the seat 6 is located at a position too far from the range in which the molten bonding material 8 flows, there will be no advantageous effect of controlling the shape of the bonding material 8 while heated and each side of the formed bonding part 3 may easily become non-uniform. Specifically speaking, the detection accuracy can be enhanced by setting the length between each side of the bonding part 3 and each side of the seat 6 so that the molten bonding material 8 will substantially reach each side of the seat 6.

Since each side of the bonding part 3 is formed to reach each side of the metalized layer 5, that is, each side of the seat 6 in this embodiment as described above, the detection accuracy can be enhanced.

[Functions of Seat at Stem]

Functions of the seat 6 for the stem 4 will be explained.

Figure 5:
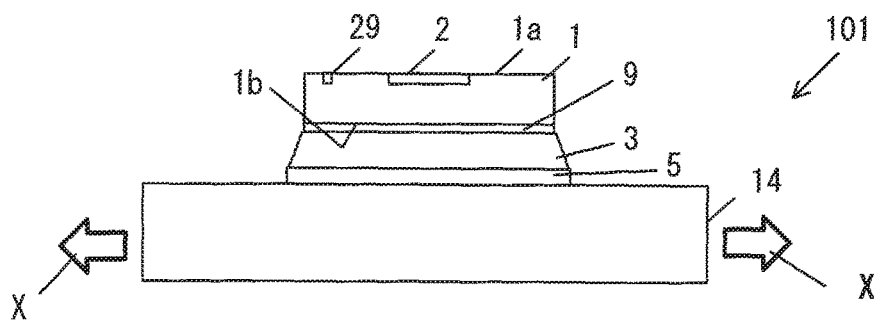
FIG. 5 is a sectional view of a sensor unit of a comparative example.
Figure 6A:
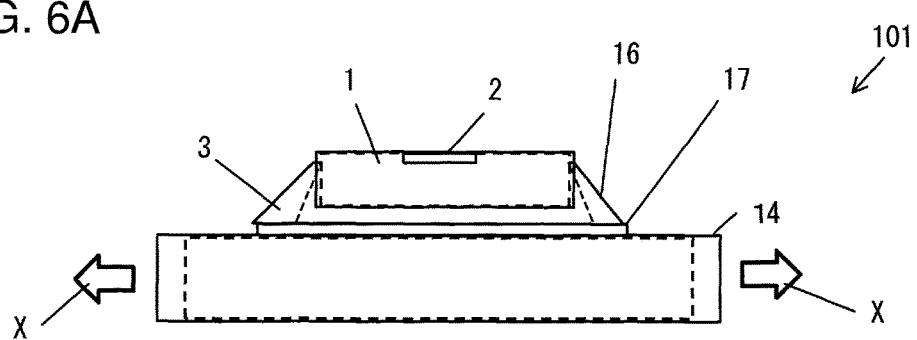
FIG. 6($a$) is a diagram illustrating deformations when a stem is displaced in the sensor unit illustrated in FIG. 5.
Figure 6B:
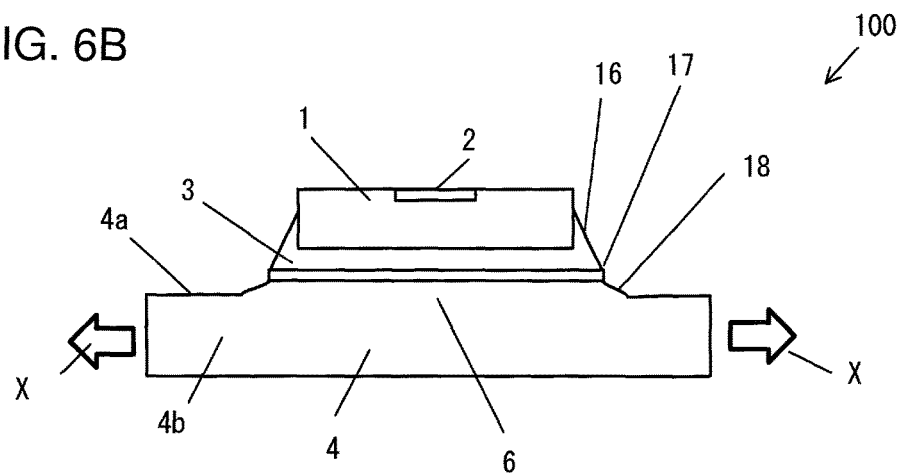

FIG. 5 is a sectional view of a sensor unit of a comparative example. FIG. 6(a) is a diagram illustrating deformations when a stem is displaced in the sensor unit illustrated in FIG. 5. FIG. 6(b) is a diagram illustrating deformations when the stem is displaced in the sensor unit according to an embodiment of the present invention as illustrated in FIG. 2.

Regarding a sensor unit 101 illustrated in FIG. 5, the seat 6 is not formed on a stem 14. When a load is imposed on the stem 14 in X-directions indicated with arrows, sensor unit 101 deforms from a state indicated with dotted lines in FIG. 6(a) to a state indicated with solid lines. Specifically speaking, since the sensor chip 1 which is formed of a semiconductor substrate of silicon or the like has a large Young's modulus, it deforms less than surrounding materials. Accordingly, the bonding part 3 deforms corresponding to displacement occurring at the stem 14 and particularly large stress occurs at the side end 17 of a fillet part 16 of the bonding part 3. This stress causes creep deformation at the bonding part 3 and degrades stability of strain detection.

On the other hand, regarding the sensor unit 100 with the protruded seat 6 formed on the stem 4 according to an embodiment of the present invention, the protruded seat 6 is formed on the stem 4 to increase the thickness and the rigidity of the seat 6 is higher than the rigidity of the peripheral portion 4b.

Accordingly, when the load is imposed on the stem 4 in the X-directions indicated with arrows as illustrated in FIG. 6(b), part of the protruded seat 6 close to a main body of the stem 4 deforms, but a deformation amount reduces at positions further away from the main body of the stem 4. Specifically speaking, side faces 18 of the protruded seat 6 form a shape inclined with respect to the X-directions relative to the stem 4 (the shape whose section is close to a trapezoid). Therefore, the deformation amount of the bonding part 3 becomes smaller than the deformation amount which has occurred to the main body of the stem 4 because of the protrusion seat 6 and the stress on the side end 17 of the fillet part 16 of the bonding part 3 reduces as compared to the case where there is no protruded seat 6.

In this way, it becomes possible to suppress the creep deformation occurring at the bonding part 3, secure stability of the strain detection, and increase its life as a sensor by providing the stem 4 with the protruded seat 6.

Figure 7:
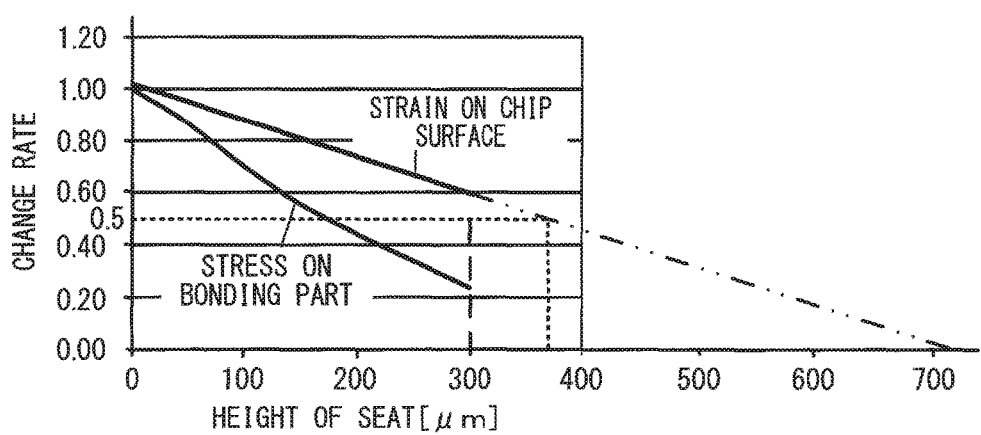
FIG. 7 is a characteristic chart illustrating the relationship between the height of a seat on the stem and stress on a bonding part and between the height of the seat and strain on a Chip surface.

FIG. 7 is a characteristic chart illustrating the relationship between the height of the seat on the stem and stress on the bonding part and between the height of the seat and strain on a chip surface. Each characteristic Chart represents a change rate indicative of a rate of a value relative to a measured value when there is no seat, with respect to the height of the seat up to 300 μm. The stress on the bonding part is represented by a value of stress occurring at the side end 17 of the fillet part 16 of the bonding part 3.

Referring to stress characteristics of the bonding part, as the height of the seat 6 increases, the stress occurring at the side end 17 of the fillet part 16 of the bonding part 3 decreases. Specifically speaking, the seat 6 can reduce the stress occurring at the bonding part 3 and also reduce the creep deformation of the bonding part 3 and has the advantageous effect of enhancing sensor characteristics. Furthermore, the seat 6 can reduce the progress of cracks which may occur in the bonding part and is effective in enhancing the life of a sensor product.

Referring to characteristics of the strain on the chip surface, as the height of the protruded seat 6 increases, the strain occurring on the chip surface decreases.

As the strain quantity on the surface of the sensor chip 1 reduces, it may be considered that sensitivity as the sensor might degrade. However, a rate of decrease in the strain quantity of the sensor chip 1 is lower than a rate of decrease in the stress on the bonding part 3. Therefore, the mechanical quantity measuring device is designed to have the structure capable of securing the performance and satisfying sensor output stability and reliability as the mechanical quantity measuring device by setting the height of the seat 6 within the range enabling good sensitivity for measurement of the strain quantity and sufficient reduction of the stress on the bonding part.

Regarding the characteristics of the strain on the chip surface in FIG. 7, a two-dot chain line is an extension of the above-described characteristic curve. When the height of the seat 6 is approximately 700 μm, the change rate in the strain on the chip surface becomes 0 and the detection capability will be lost. In consideration of detection accuracy of the strain sensor, a problem might occur upon practical use of the strain sensor when the change rate becomes less than 0.5. In other words, when the change rate of the strain on the chip surface is equal to or more than 0.5, it can be considered to be usable as the strain sensor. When the change rate of the strain on the chip surface is 0.5, the corresponding height of the seat 6 is approximately 350 μm to 400 μm as indicated with a dotted line in FIG. 7. Therefore, when the height of the seat 6 is equal to or less than 300 μm, the change rate of the strain on the chip surface is 0.5 or more so that it can be used as the strain sensor.

It has been found as results of such stress analysis, bondability examination, and characteristic evaluation that a certain degree of advantageous effects can be obtained when the seat 6 is shaped so that its area is approximately equal to or less than ten times as large as the area of the chip; however, the seat 6 should preferably be shaped so that its area be approximately five times or less as large as the area of the chip. The seat 6 whose area is equal to or greater than ten times as large as that of the chip has a lower effect of reducing the stress on the bonding part 3 of the sensor chip 1.

Furthermore, it is important that the seat 6 is bilaterally symmetric, or preferably symmetric with respect to a point, such as a square, a rectangle, a hexagon, or a circle as viewed from above. Also, as it is obvious from the above explanation, it is desirable that the sensor chip 1 on the protruded seat 6 should be positioned at substantially the center of the seat 6. In consideration of viewpoints such as easiness in manufacturing, cost, yield, and variability from among evaluation results of protruded seats of the above-mentioned various shapes, a square seat whose area is approximately 1.5 times as large as the area of the sensor chip and which is a protrusion seat with the height of the seat being 50 μm to 150 μm exhibits good sensor characteristics.

Variation of Embodiment 1

Figure 8:
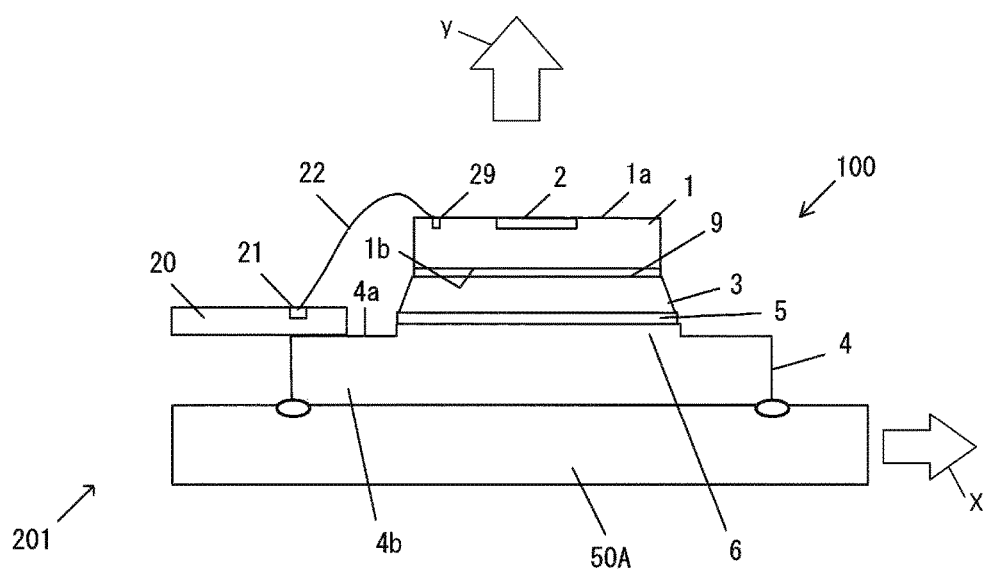
FIG. 8 is a sectional view of a mechanical quantity measuring device, illustrating a variation of Embodiment 1.

FIG. 8 is a sectional view of a mechanical quantity measuring device, illustrating a variation of Embodiment 1.

The mechanical quantity measuring device 200 according to Embodiment 1 has the structure in which the sensor unit 100 is fixed to the container 50. In the variation in FIG. 8, a mechanical quantity measuring device 201 has a structure in which the sensor unit 100 is fixed to a base (fixing part) 50A which is a measured object to be measured. The sensor unit 100 is the same sensor unit as the one which is used in Embodiment 1 and includes the stem 4 having the protruded seat 6, and the bonding part 3 for bonding the sensor chip 1 and the stem 4 together.

The base 50A is a flat plate-like member without any opening and covers the entire lower surface of the stem 4. The metallic bonding or the mechanical bonding as mentioned in Embodiment 1 can be applied to fix the stem 4 and the base 50A together. However, the stem 4 and the base 50A can be fixed at the peripheral portion of the stem 4 or, alternatively, they can be fixed together at a central portion of the lower surface of the stem 4 or over the entire lower surface of the stem 4.

The mechanical quantity measuring device 201 of Variation 1 detects the difference between X-direction strain and Y-direction strain which occur at the strain detector 2 of the sensor chip 1 along with deformations of the base 50A in the X-direction and the Y-direction.

Although the base 50A is illustrated as the measured object, the base 50A may be simply a fixing member for fixing the stem 4 and the measured object may be attached to the base 50A. Furthermore, the base 50A which serves simply as the fixing member for fixing the stem 4 may be fixed to the peripheral portion of the opening 56 in the container 50 as illustrated in FIG. 1 to measure the pressure of the gas G in the internal space 51 of the container 50.

Other structures in Variation 1 are similar to those in Embodiment 1 and the same reference numerals are assigned to corresponding members and an explanation about them has been omitted.

Embodiment 2

Embodiment 2 of the present invention will be explained with reference to FIG. 9 to FIG. 11.

Figure 9:
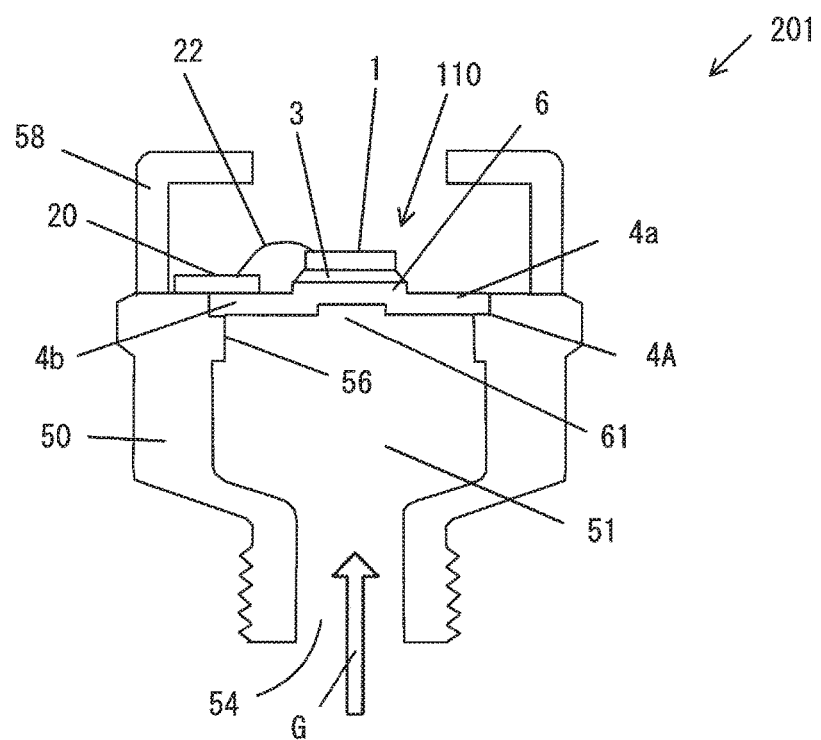
FIG. 9 is a sectional view illustrating Embodiment 2 of a mechanical quantity measuring device according to the present invention.
Figure 10:
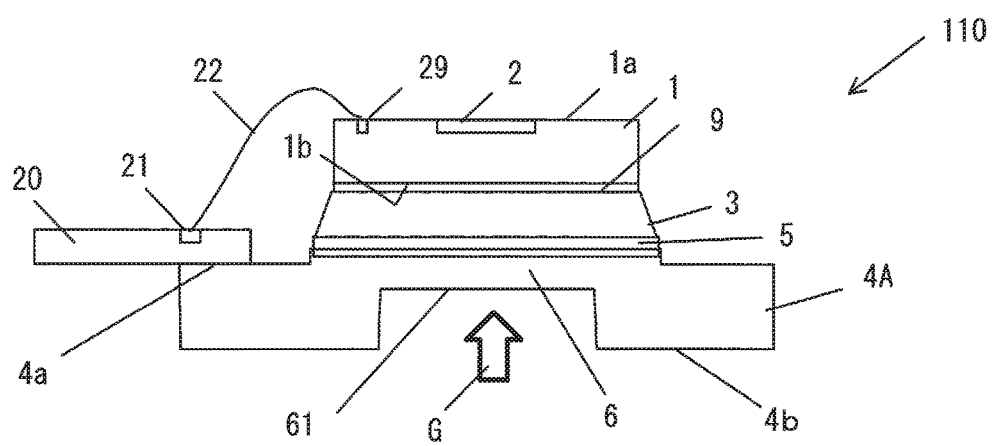
FIG. 10 is an enlarged view of a sensor unit of the mechanical quantity measuring device illustrated in FIG. 9.
Figure 11A:
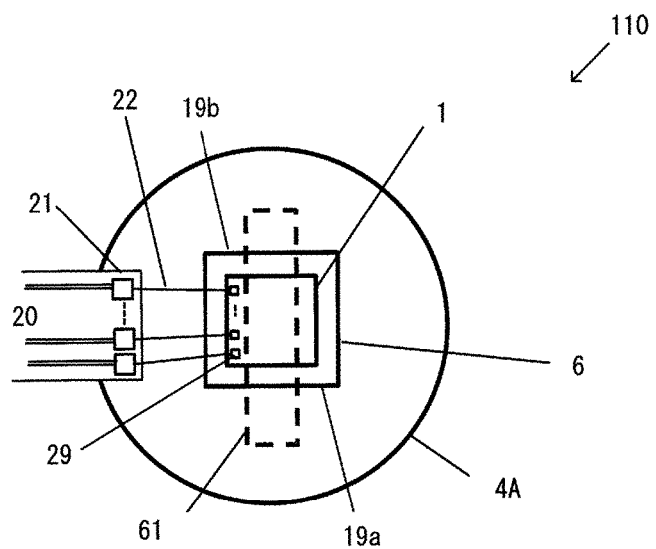
FIG. 11($a$) and FIG. 11($b$) are respectively plan views of the sensor unit illustrated in FIG. 10 as viewed from above.
Figure 11B:
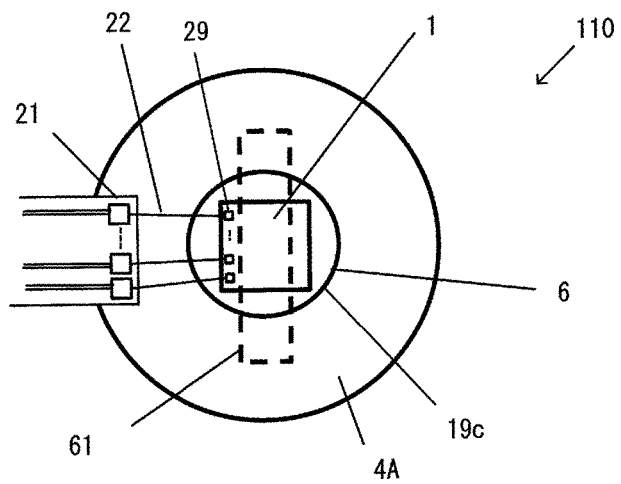

FIG. 9 is a sectional view illustrating Embodiment 2 of a mechanical quantity measuring device according to the present invention. FIG. 10 is an enlarged view of a sensor unit of the mechanical quantity measuring device illustrated in FIG. 9, FIG. 11(a) and FIG. 11(b) are respectively plan views of the sensor unit illustrated in FIG. 10 as viewed from above. FIG. 11(a) is an example where a planar shape of the base 6 is a rectangular shape and FIG. 11(b) is an example where the planar shape of the base 6 is a circular shape. Incidentally, in Embodiment 2, a stem 4A is configured as a disc-shaped thin plate member.

The difference between the methanical quantity measuring device 201 of Embodiment 2 and the mechanical quantity measuring device in Embodiment 1 is that a groove 61 is formed in the stem 4A of the sensor unit 110.

Embodiment 2 will be explained below by focusing on this difference.

The rectangular groove 61 is formed on a surface of the stem 4A, that is the other surface of the side on which the seat 6 is formed, namely, on the side facing the internal space 51 of the container 50. The length of a short side of the rectangular groove 61 is formed to be narrower than the width of the seat 6. The groove 61 is formed in an oblong rectangular shape extending from outside of one side end 19a to outside of the other opposite side end 19b across a substantially central part of the seat 6 at the stem 4A as illustrated in FIG. 11(a). Both ends of the groove 61 extending across the back surface of the stem 4A do not continuously extend beyond the peripheral portion of the stem 4A towards outside, so that specified rigidity is thereby retained. A pair of side edges along the lengthwise direction of the groove 61 extends in parallel with a pair of sides of the sensor chip 1. Furthermore, the depth of the groove 61 is designed so that the bottom of the groove 61 does not reach the upper surface 4a of the stem 4A.

Specifically speaking, because the groove 61 is formed in the stem 4A, the seat 6 becomes partially thin and the stem 4A is configured as a diaphragm with low rigidity. When the pressure of the gas G is applied to inside of the container 50 for such mechanical quantity measuring device 201, the thin thickness part of the seat 6 which serves as the diaphragm deforms preferentially. This deformation is transmitted to the sensor chip 1 bonded to the seat 6 via the bonding part 3. Accordingly, the strain detector 2 of the sensor chip 1 measures the strain, that is, the pressure. A pressure sensor for measuring the pressure inside piping can be configured by making the container 50 serve as, for example, a pressure measuring part which branches off from piping where a fluid to be measured flows.

In Embodiment 2, the groove 61 which is parallel to the pair of side edges of the sensor chip 1 is formed at the seat 6 of the stem 4A. Since the thin thickness part of the seat 6 for the stem 4A has low rigidity, that part easily deforms.

Since the groove 61 is formed in a rectangular shape, the strain on the sensor chip 1 as caused by the deformation of the stem 4A is larger in a direction perpendicular to the lengthwise direction than in the lengthwise direction and the detection capability of the sensor chip 1 which outputs the strain difference can be enhanced.

If a structure in which the stem 4A had no protruded seat 6 was used in Embodiment 2, large stress would have been caused to the side end 17 of the fillet part 16 of the bonding part 3 and creep deformation of the bonding part 3 would have tended to easily occur and such creep deformation might have led to breakage of the bonding part 3 or breakage of the sensor chip 1 (see FIG. 6(a) and FIG. 6(b)). However, in a case of the structure in which the protruded seat 6B is provided in a region where the sensor chip 1 is mounted, it is possible to reduce the stress on the side end 17 of the fillet part 16, reduce a creep deformation amount of the bonding part 3 in use, and contribute to stability of a sensor output value.

Therefore, the sensor unit 110 described in Embodiment 2 also has the same advantageous effects as those of Embodiment 1.

The planar shape of the seat 6 may be a rectangular shape as illustrated in FIG. 11(a), but may also be a circular shape as illustrated in FIG. 11(b). If the seat 6 is formed in the circular shape as illustrated in FIG. 11(b), the seat 6 can be formed easily and the efficiency of processing steps can be enhanced. Incidentally, even when the seat 6 is circular as illustrated in FIG. 11(b), the groove 61 is provided through the center of the seat 6 and extends across an outer periphery 19c of the seat 6.

Therefore, Embodiment 2 has the same advantageous effects as those of Embodiment 1.

Other structures in Embodiment 2 are similar to those in Embodiment 1 and the same reference numerals are assigned to corresponding members and an explanation about them has been omitted.

Embodiment 3

Figure 12:
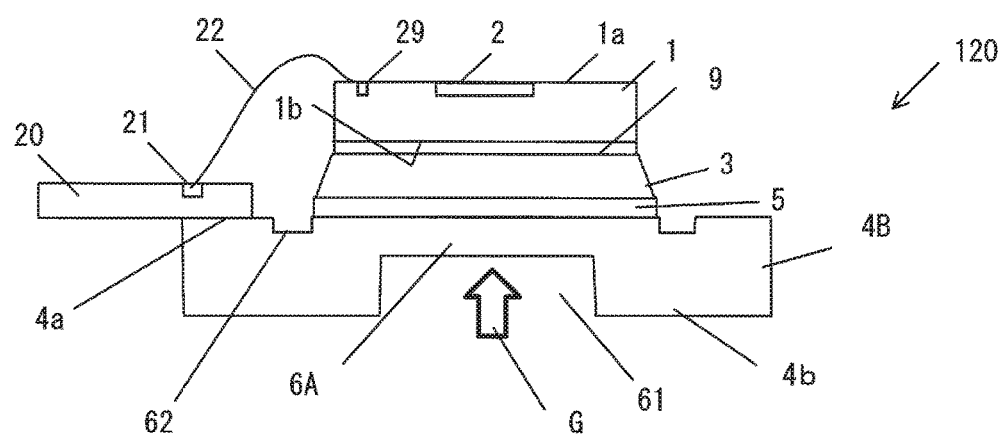
FIG. 12 is a sectional view illustrating Embodiment 3 of a sensor unit of a mechanical quantity measuring device according to the present invention.
Figure 13A:
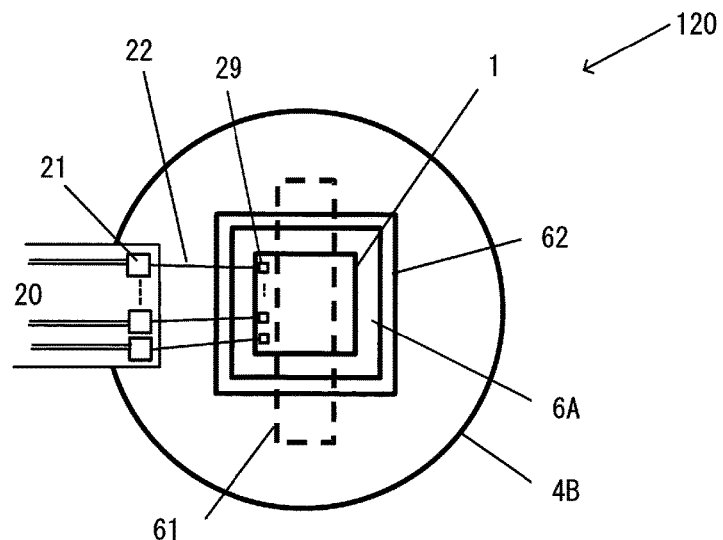
FIG. 13($a$) and FIG. 13($b$) are respectively plan views of the sensor unit illustrated in FIG. 12 as viewed from above.
Figure 13B:
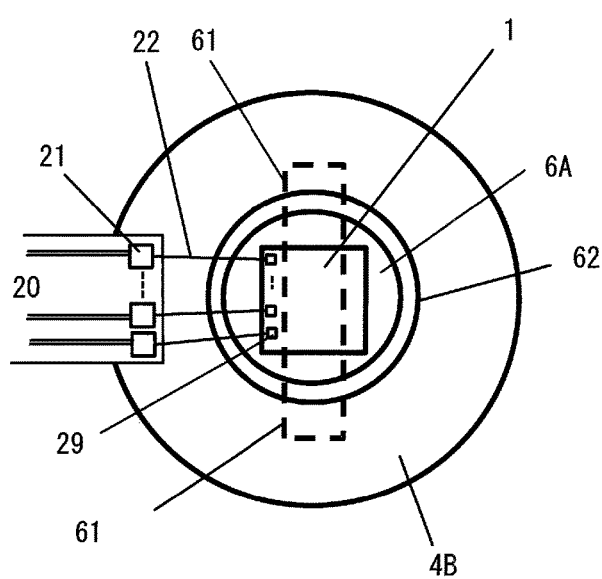

FIG. 12 and FIG. 13 illustrate a sensor unit of a mechanical quantity measuring device according to Embodiment 3 of the present invention. FIG. 12 is a sectional view of the sensor unit according to Embodiment 3 and FIG. 13(a) and FIG. 13(b) are respectively plan views of the sensor unit illustrated in FIG. 12 as viewed from above. FIG. 13(a) is an example where the planar shape of the seat 6 is a rectangular shape and FIG. 13(b) is an example where the planar shape of the seat 6 is a circular shape. Incidentally, in Embodiment 2, a stem 4B is configured as a disc-shaped thin plate member.

The difference between a sensor unit 120 of Embodiment 3 and the sensor unit 110 of Embodiment 2 is that the upper surface 4a of the stem 4B is flat and a seat 6A is defined by a frame-like groove part 62 formed in a central part of the sensor unit 120.

The frame-like groove part 62 is provided in the upper surface 4a of the stem 4B and the seat 6A is formed inside this frame-like groove part 62. The upper surface of the seat 6A is flush with the upper surface 4a of the peripheral portion 4b and is flush with the surface on which the printed circuit board 20 is mounted.

The planar shape of the groove part 62 may be a rectangular shape as illustrated in FIG. 13(a), or may be a circular shape as illustrated in FIG. 13(b). If the seat 6A is formed in the circular shape as illustrated in FIG. 13(b), the seat 6 can be formed easily and the efficiency of processing steps can be enhanced. The shape of the groove part 62 illustrated in FIG. 13(a) is a square shape, but it may be an oblong rectangular shape.

In Embodiment 3, the seat CA is formed by forming the groove 62 by means of, for example, counter boring or laser processing. Therefore, the efficiency of the processing steps can be enhanced better than Embodiment 2 in which the protruded base 6 is formed.

The groove part 62 in the stem 4 may be formed before it is bonded to the sensor chip 1 or after it is bonded to the sensor chip 1. The groove part 62 can be formed advantageously before bonded to the sensor chip 1 so that problems such as grinding sludge generated at the time of processing or contamination of the sensor chip will not be caused. When the groove part 62 is formed after it is bonded to the sensor chip 1, there is an advantage of no flowing of the bonding material 8 into the groove 61. Furthermore, even when the shape of the fillet part 16 around the bonding part 3 becomes distorted or the position to mount the sensor chip 1 is slightly displaced, the groove part 62 can be formed by, for example, shifting the center of the groove part 62 to coincide with the center position of the fillet part 16 or the center position of the sensor chip 1 so that modifications can be made.

When a structure in which the stem 4B does not have the protruded seat CA is used in Embodiment 3, large stress is caused to the side end 17 of the fillet part 16 of the bonding part 3 and creep deformation of the bonding part 3 tends to easily occur and such creep deformation may lead to breakage of the bonding part 3 or breakage of the sensor chip 1 (see FIG. 6(a) and FIG. 6(b)). However, in the structure provided with the protruded seat 6A surrounded by the frame-like groove part 62 in the region where the sensor chip 1 is mounted, it is possible to reduce the stress on the side end 17 of the fillet part 16, reduce the creep deformation amount of the bonding part 3 in use, and contribute to the stability of the sensor output value.

Therefore, the sensor unit 120 described in Embodiment 3 also has the same advantageous effects as those of the sensor unit 110 in Embodiment 2.

Therefore, also in Embodiment 3, the rigidity of a thin thickness part of the stem 4B where the groove 61 is formed is low, so that the stem 4B easily deforms and the groove part 62 formed in the upper surface 4a of the stem 4B can reduce the stress on the side end 17 of the fillet part 16. Therefore, Embodiment 3 has the same advantageous effects as those of Embodiment 2.

Other structures in Embodiment 3 are similar to those in Embodiment 1 and the same reference numerals are assigned to corresponding members and an explanation about them has been omitted.

Variation of Embodiment 3

Figure 14:
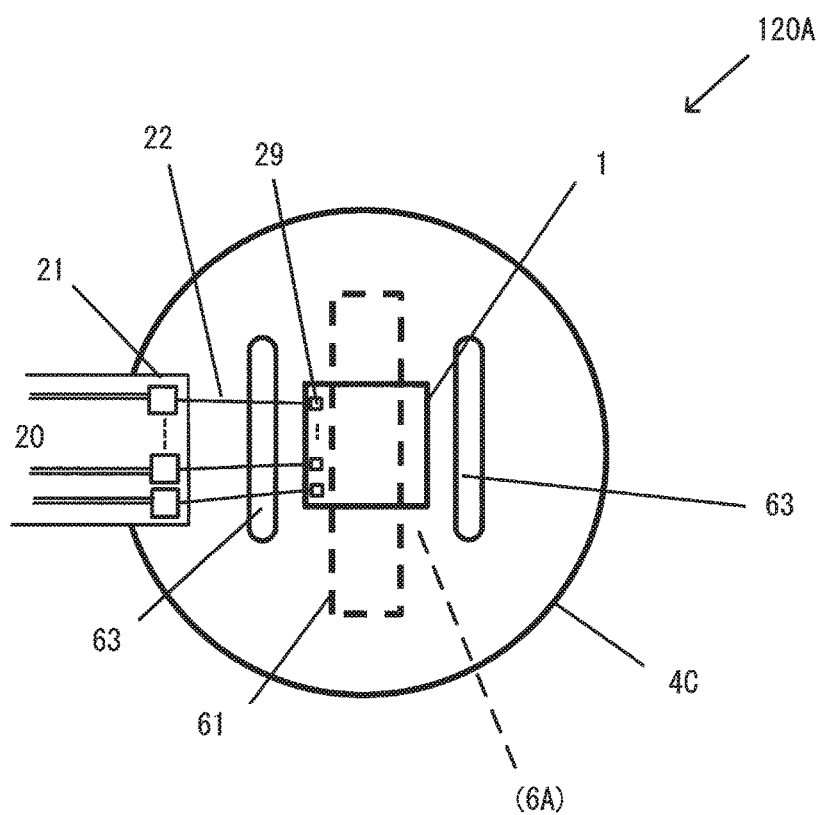
FIG. 14 is a plan view illustrating a variation of Embodiment 3.

FIG. 14 is a plan view illustrating a variation of Embodiment 3.

Regarding a sensor unit 120A of the variation of Embodiment 3, a pair of groove parts 63 in parallel with the side edges of the groove 61 in its lengthwise direction is formed, in place of the frame-like groove part 62, with the length of the groove parts 63 longer than the length (width) of the sensor chip 1.

Accordingly, regarding a stem 4C of this sensor unit 120A, a region inside the pair of groove parts 63, that is, a region between one groove part 63 and the other groove part 63 is flush with the upper surface 4a of the peripheral portion 4b and is formed continuously with the peripheral portion 4b. Therefore, no seat which is clearly separated from the peripheral portion 4b is formed. The pair of groove parts 63 is formed symmetrically with respect to the x-axis and y-axis passing through the center of the sensor chip 1. The groove 61 formed in the lower surface of the stem 4C is also in a shape symmetrical with respect to the x-axis and y-axis passing through the center of the sensor chip 1.

Specifically speaking, no groove which serves as a boundary with the peripheral portion 4b is formed in the stem 4C in a direction perpendicular to the pair of groove parts 63 and a region to be the seat ((6A) in FIG. 14) is defined as the inside region set by the pair of groove parts 63 facing opposite each other. However, the rigidity of the thin thickness part of the stem 4C where the groove 61 is formed is low, so that the stem 4C deforms preferentially.

Also in this variation, the region to be the seat where the sensor chip 1 is mounted is provided inside the pair of groove parts 63. Therefore, similarly to Embodiment 3, it is possible to reduce the stress on the side end 17 of the fillet part 16, reduce the creep deformation amount of the bonding part 3 in use, and contribute to the stability of the sensor output value.

In the above-described example, the pair of groove parts 63 in parallel with the side edges of the groove 61 in its lengthwise direction is formed in the stem 4C; however, a pair of groove parts in parallel with the side edges of the groove 61 in its transverse direction may be formed with the length of the move parts longer than the length (width) of the sensor chip 1.

Embodiment 4

Figure 15:
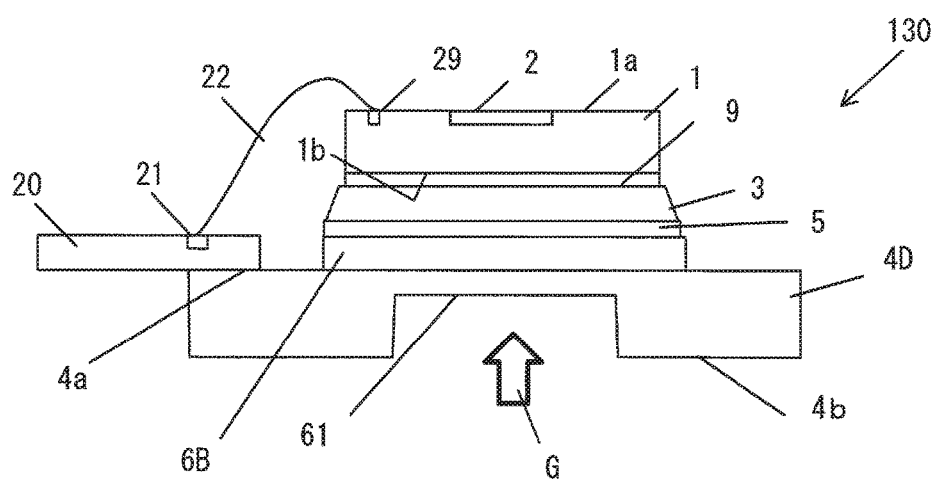
FIG. 15 is a sectional view illustrating Embodiment 4 of a sensor unit of a mechanical quantity measuring device according to the present invention.

FIG. 15 is a sectional view illustrating Embodiment 4 of a sensor unit of a mechanical quantity measuring device according to the present invention.

The difference between a sensor unit 130 of Embodiment 4 and the sensor unit 110 of Embodiment 2 is that regarding the sensor unit 130, a seat 69 is formed by means of film formation such as plating, vapor deposition, or sputtering.

An upper surface 4a of a stein 4D is flat and the groove 61 is formed in its lower surface. The seat 6B is formed at approximately the center of the upper surface 4a of the stem 4D. The seat 6B should preferably be formed by means of plating, but may be formed by means of vapor deposition or sputtering as mentioned above. In a case of plating, Ni, Cu, and so on can be used.

For example, the Young's modulus of Cu is approximately 110 GPa, which is larger than approximately 57 GPa, that is, the Young's modulus of Au-20 wt % Sn solder which is considered to be a rigid material among solders.

When the gas G causes the pressure to be applied to the stem 4D in a direction indicated with an arrow as illustrated in FIG. 15, a thin thickness part of the stem 4D where the move 61 is formed deforms preferentially. This deformation is transmitted to the sensor chip 1 bonded to the seat 6B via the bonding part 3. As a result, the strain detector 2 of the sensor chip 1 measures strain, that is, the pressure.

When a structure without the seat 69 formed by film formation is used in Embodiment 4, large stress is caused to the side end 17 of the fillet part 16 of the bonding part 3 and creep deformation of the bonding part 3 tends to easily occur (see FIG. 6(a) and FIG. 6(b)). Such creep deformation may lead to breakage of the bonding part 3 or breakage of the sensor chip 1. However, in a case of the structure in which the protrusion-shaped seat 6B made of the material with a large Young's modulus is provided in the area where the sensor chip 1 is mounted, it is possible to reduce the stress on the side end 17 of the fillet part 16, reduce the creep deformation amount of the bonding part 3 in use, and contribute to the stability of the sensor output value.

Therefore, the sensor unit 130 indicated in Embodiment 4 also has the same advantageous effects as those of Embodiment 2.

The respective embodiments of the present invention have the following advantageous effects as explained above.

(1) The stem 4, 4A to 4D, to which the sensor chip 1 is bonded via the bonding part 3, and the container 50 are integrally molded or fixed through metallic bonding or mechanical bonding. Therefore, even when the mechanical quantity measuring device is used under a high-temperature environment, degradation of detection accuracy caused by insufficient bonding power will not be caused unlike the conventional mechanical quantity measuring device in which the stem is fixed to the fixing part by using the adhesive agent made of resin; and, therefore, reliability can be enhanced.

(2) In each embodiment, the stem 4, 4A to 4D is provided with the protrusion-shaped seat 6, CA, or 6B and the rigidity of the seat 6, 6A, or 6B is set higher than the rigidity of the peripheral portion 4b. Therefore, when displacement is applied to the stem 4, 4A to 4D, the deformation amount on the upper surface of the seat 6, 6A, or 6B reduces and it is thereby possible to suppress the creep deformation which may be caused to the bonding part 3, secure the stability of detection characteristics, and lengthen the life.

(3) In Embodiments 2 and 3, the rigidity of part of the seat 6 or 6A is set lower than the rigidity of the peripheral portion 4b by providing the groove 61 in the other surface of the protrusion-shaped seat 6 or 6A formed on the stem 4A or 4B. Similarly, in Embodiment 4, the seat 6B is formed by means of film formation on the upper surface 4a of the stem 4D and the groove 61 is provided in the other surface of the seat 69, thereby making the rigidity of part of the seat 6B lower than the rigidity of the peripheral portion 4b. Therefore, when the load is applied to the sensor unit 110, 120, or 130, part of the seat 6, 6A, or 6B can be made to deform preferentially.

(4) Since the configuration that enables part of the seat 6, 6A, or 6B to deform preferentially is employed as described in Embodiments 2 to 4, the pressure of the gas G inside the internal space 51 in the container 50 can be detected by fixing the sensor unit 110, 120, or 130 to the container 50 into which the gas G flows.

(5) in a case of the structure in which the groove part 62 or 63 is formed in the other surface of the stem 4B or 4C where the groove 61 is formed, and the inner region of the groove part 62 or 63 is formed as the seat 6A as in Embodiment 3 and its variation, processing can be performed easily and productivity can be enhanced.

(6) In a case of the structure in which the seat 6B is formed by means of film formation such as plating, vapor deposition, or sputtering as in Embodiment 4, the protrusion-shaped seat 69 can be formed efficiently.

Incidentally, in each embodiment described above, the metalized layers 5 and 9 formed on the seat 6, CA, or 6B and the sensor chip 1 are not necessarily requisite and either one or both of them may not be formed. Moreover, the printed circuit board 20 does not have to be located on the upper surface 4a of the stem 4, 4B, 4C, or 4D.

A mechanical quantity measuring device may be obtained by combining the aforementioned respective embodiments and the variations with each other.

The sensor unit 110, 120, or 130 described in Embodiment 2 to 4 can be solely used as a mechanical quantity measuring device without being secured to, for example, the container 50.

Furthermore, the present invention can also be adapted to any structures in which the structures described in the respective embodiments are appropriately modified. In short, regarding the mechanical quantity measuring device equipped with the sensor unit bonded to the upper surface of the seat formed on the stem via the bonding material formed of the metallic material or the glass material, it is only required that the stem and the fixing part should be integrally molded or fixed through metallic bonding or mechanical bonding.

The disclosed content of the following priority application is herein incorporated by reference: Japanese Patent Application No. 014-15383 (filed on Jan. 30, 2014).

REFERENCE SIGNS LIST 1 sensor chip
2 strain detector
3 bonding part
4, 4A to 4D stem
4a upper surface
4b peripheral portion
5, 9 metalized layer
6, 6A, or 6B seat
8 bonding material
20 printed circuit board
22 bonding wires (lead-out wiring part)
50 container (fixing part)
50A base (fixing part)
51 internal space
54 gas intake
56 opening
58 case
61 groove
62 or 63 groove part(s)
100, 110, 120, 120A, or 130 sensor unit
200 or 201 mechanical quantity measuring device

The invention claimed is:

1. A mechanical quantity measuring device comprising:
a sensor chip having a strain detector formed on a surface of a semiconductor substrate and a plurality of electrodes;
a stem having a seat that protrudes from an adjacent peripheral portion and has an upper surface that is attached to a lower surface of the sensor chip by a bonding material formed from a metallic material or a glass material;
a lead-out wiring part including a plurality of wires that are electrically connected to the plurality of electrodes; and
a fixing part configured to fix the stem, wherein:
the stem and the fixing part are metallically bonded to one another,
the stem is a rectangular-shaped plate member,
the seat has a rectangular shape larger than the sensor chip, and
the sensor chip is bonded to the stem via the bonding material, the bonding material including solder containing Sn-3.5 wt %, Ag-0.5 wt %, or Au-20 wt %.

2. The mechanical quantity measuring device according to claim 1, wherein:
the fixing part is an object to be measured that has a larger area than that of the stem and fixes the peripheral portion of the stem.

3. The mechanical quantity measuring device according to claim 2, wherein:
a region in the stem where the seat is formed has higher rigidity than rigidity of the peripheral portion.

4. The mechanical quantity measuring device according to claim 1, wherein:
a groove that is narrower than the seat and protrudes beyond an outer circumference of the seat is formed in a surface of the stem that is a reverse side of a surface to which the sensor chip is bonded.

5. The mechanical quantity measuring device according to claim 4, wherein:
the groove is formed across the seat from its one side to its opposite side.

6. The mechanical quantity measuring device according to claim 5, wherein:
the groove that extends across the seat is formed so that one end and another end of the groove do not extend beyond the peripheral portion of the stem.

7. The mechanical quantity measuring device according to claim 4, wherein:
the stem has at least a pair of groove parts that is parallel to or perpendicular to the groove and is formed in the peripheral portion adjacent to the seat.

8. The mechanical quantity measuring device according to claim 4, wherein:
the stem has a frame-like groove part that surrounds the seat and is formed in the peripheral portion adjacent to the seat.

9. The mechanical quantity measuring device according to claim 1, wherein:
the fixing part is formed as a cylindrical pressure introducing part.

10. The mechanical quantity measuring device according to claim 9, wherein:
the fixing part has an opening that exposes at least part of a surface of the stem that is a reverse side of a surface to which the sensor chip is bonded; and
the sensor chip measures pressure inside the cylindrical fixing part.

11. The mechanical quantity measuring device according to claim 9, wherein:
a metal layer is formed at at least one of the upper surface of the seat and the lower surface of the sensor chip.

12. The mechanical quantity measuring device according to claim 9, wherein:
the bonding material is formed so that its outer peripheral portion reaches at least part of an outer circumference of the seat.

13. The mechanical quantity measuring device according to claim 1, wherein:
the seat is formed on the stem by means of film formation.

14. The mechanical quantity measuring device according to claim 1, wherein:
a height of the seat from the adjacent peripheral portion is 300 μm or less.

* * * * *